United States Patent [19]

Gunter

[11] Patent Number: 4,660,127
[45] Date of Patent: Apr. 21, 1987

[54] FAIL-SAFE LEAD CONFIGURATION FOR POLAR SMD COMPONENTS

[75] Inventor: Charles E. Gunter, Jupiter, Fla.

[73] Assignee: North American Philips Corporation, New York, N.Y.

[21] Appl. No.: 810,445

[22] Filed: Dec. 17, 1985

[51] Int. Cl.⁴ .................... H01G 9/05; H01G 9/06
[52] U.S. Cl. ........................ 361/433; 29/570
[58] Field of Search ............ 29/570; 361/397, 306, 361/412, 400–406, 433, 321

[56] References Cited

U.S. PATENT DOCUMENTS

| 3,679,941 | 7/1972 | La Combe et al. | 361/406 X |
| 3,789,274 | 1/1974 | Pfister et al. | 361/433 |
| 4,288,842 | 9/1981 | Voyles | 361/433 |
| 4,510,554 | 4/1985 | Irikura | 361/433 |
| 4,539,623 | 9/1985 | Irikura et al. | 361/433 |
| 4,571,664 | 2/1986 | Hyland | 29/570 |
| 4,574,297 | 3/1986 | Ooi | 361/405 X |

Primary Examiner—Donald A. Griffin
Attorney, Agent, or Firm—Jack E. Haken; James J. Cannon, Jr.

[57] ABSTRACT

A fail-safe lead configuration for surface mountable chip-like polar electrical components wherein the lead of a first polarity is singulated and the lead of the second polarity is bifurcated, having the branches spaced a part such that a rotation of the device in its intended mounting location, thus reversing its polarity, or a displacement from its intended, position will result in an open circuit rather than a short circuit or other circuit failure.

7 Claims, 17 Drawing Figures

FAIL-SAFE LEAD CONFIGURATION FOR POLAR SMD COMPONENTS

BACKGROUND OF THE INVENTION

1. Field of the Invention

The invention relates generally to a chip-like polar electrical component of a type designed for surface mounting, wherein the positive and negative leads are arranged to prevent electrical contact with pads on a printed circuit board in the event said device is mounted to a printed circuit board with its polarity reversed, or otherwise displaced from its intended position.

2. Description of the Prior Art

Chip-like electrical components, sometimes referred to as leadless components and/or surface mounted devices, are well known in the prior art. While most such chip-like components are not polar devices, the solid electrolyte capacitor among others is a polar device. The present invention, while not limited to solid electrolyte capacitors, will be described in terms of these devices.

The prior art with respect to solid electrolyte chip capacitors is well known. Among the recent U.S. patents which describe this prior art in some detail are U.S. Pat. Nos. 4,510,554 and 4,539,623, both assigned to Matsushita Electric Industrial Co., Ltd. The prior art is also discussed in U.S. patent application Ser. No. 670,088, filed Nov. 9, 1984, and assigned to the assignee of this application. This latter application is incorporated herein by reference.

In view of the fact that the construction of the solid electrolyte chip capacitor is thoroughly disclosed in the prior art referenced above, such a discussion will be omitted from the present application.

Prior art devices available commercially and disclosed in the patent art have failed to solve one significant problem which has arisen with the development of automatic placement equipment for the surface mounting of chip components. If a polar device such as a solid electrolyte tantalum capacitor is surface mounted on a printed circuit board in such a way that it is rotated 180° from the intended orientation of its positive and negative terminations, the device can short, thereby causing a failure of the device, or the circuit, and possible burnout of the printed circuit board. The configuration of the leads and/or terminals and the corresponding pad area on the printed circuit board disclosed herein can prevent such a failure in the event of misplacement or other misorientation of a surface mounted polar device.

SUMMARY OF THE INVENTION

It is therefore an object of the present invention to provide a fail-safe lead configuration system for a two leaded chip-type polar device. These polar devices are small in size, can be readily massed produced and are adapted for surface mounting, while maintaining reliability in both manufacturing and in automatic placement of such polar surface mounted devices.

In accordance with the present invention, which will be described with respect to a solid electrolyte chip capacitor, there is provided a solid electrolyte chip capacitor having a capacitor body which has a porous valve metal anode member, usually of tantalum, and an anode riser wire of the same valve metal extending from one end face thereof. A dielectric oxide film is formed on the surface of the anode member. The sides and opposite end face of the capacitor element are associated with a cathode connection. A conductive counterelectrode overlaps the solid electrolyte in a region over the side faces and extends over the cathode end face. The capacitor body is then coated with an insulating substance to seal the entire capacitor body, except the cathode end face and the riser wire which will serve as lead terminations. Optionally, a second conductive coating may be applied, coextensive with the first. The entire capacitor assembly up to the anode end face may be plated with nickel, the nickel-plating being coextensive with and covering the entire conductive counterelectrode layer, or layers, which usually comprise a silver loaded epoxy. The total plated area becomes the cathode conductor. The area that is to become the cathode (negative) termination is masked off and then the remaining area of the capacitor body is sprayed with an insulative coating. The resulting device is a complete capacitor body which, for practical purposes, lacks only a means for connection to a given circuit. A J-shaped conductive anode end lead connection is positioned such that one long leg is welded to the anode riser wire and the adjacent other long leg extends downward parallel to and spaced apart from the first end of said capacitor body. The shortest leg extends from the second end of the capacitor body directly under the riser wire, to just under the anode end. This leg may also be bent outward. A non-conductive material may be applied to the interior space between the anode end lead and the capacitor body. A cathode lead connection having a generally J-shaped orientation, is utilized for receiving said capacitor body therein so that the cathode lead connection is electrically connected to said cathode terminal on said capacitor body, the base leg of said J-shaped cathode lead being positioned adjacent to and in electrical contact with said cathode terminal at said second end, the long parallel leg is positioned on the upper insulated surface of said capacitor body and the truncated leg is bent towards said lower surface of said insulated capacitor body. This leg also may be bent outward.

In accordance with the present invention, which is directed to polar two-leaded surface mountable devices, the second of said two leads, (in the embodiment illustrated the cathode lead), is bifurcated into two elongated branches, the separation being wide enough to bridge without contact a pad on a printed circuit board intended for the lead which is not so bifurcated, (in the embodiment illustrated the anode lead). The first lead is made narrow enough to fit within the pads on the printed circuit board intended for the bifurcated lead without making electrical contact with said pads. Thus, the invention pertains to the relationship between the lead size and spacing in relation to the pad size and spacing, such that if the polar device is incorrectly placed into position, then the failure mode is not catastrophic. The principal advantage of this invention is a lower manufacturing cost using this approach in comparison with other alternatives. The invention is limited in the present embodiment to two-leaded polar devices, but it is not limited to tantalum capacitors.

DESCRIPTION OF THE PREFERRED EMBODIMENT

This invention pertains to a fail-safe lead configuration for polar SMD electrical components. As mentioned earlier, the preferred embodiment will be described with respect to a solid electrolyte capacitor and specifically a tantalum chip capacitor. This embodiment is described by way of illustration and not by way of limitation.

FIGS. 1 through 4 are perspective views of an embodiment of the fail-safe lead configuration for solid electrolyte chip capacitors according to the present invention.

Figure 1:
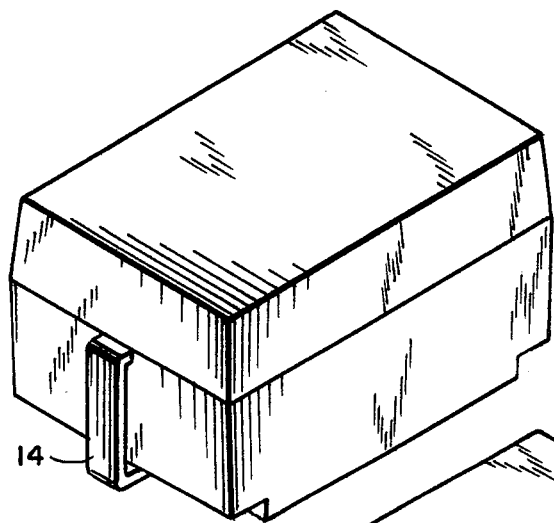
FIG. 1 is a side perspective view of an embodiment of a solid electrolytic chip capacitor showing a single lead end embodying to the present invention.
Figure 2:
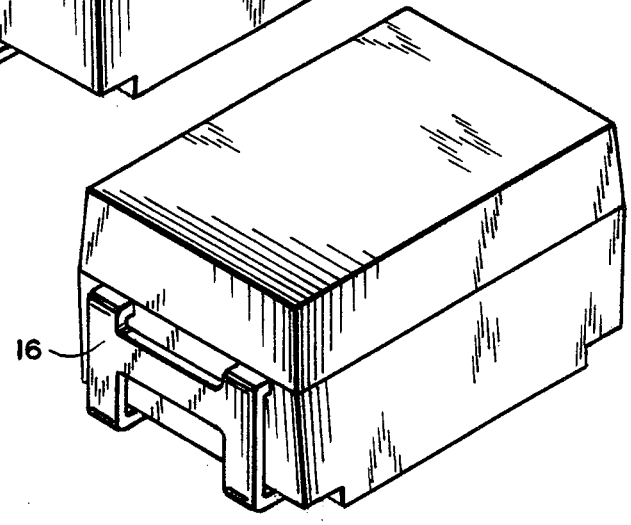
FIG. 2 is a side perspective view of an embodiment of a solid electrolytic chip capacitor showing a bifurcated lead end embodying to the present invention.
Figure 4:
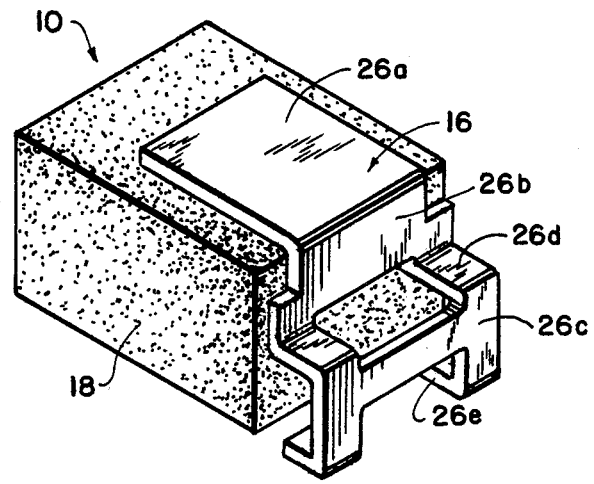
FIG. 4 is a side perspective view of the chip capacitor shown in FIG. 2 showing the inner structure of the end having the bifurcated lead.
Figure 3:
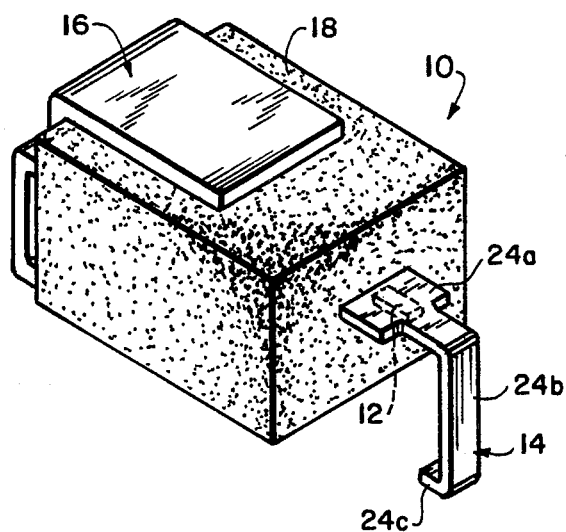
FIG. 3 is a side perspective view of the chip capacitor shown in FIG. 2 showing the inner structure of the end having the single lead.

Referring now to FIGS. 1 and 2, which show perspective views of a solid electrolytic chip capacitor having the fail-safe lead configuration for polar capacitors according to the present invention, and to FIGS. 3 and 4 which show the inner structure of the lead configuration of the chip capacitor of FIGS. 1 and 2 by way of a perspective view, the reference numeral 10 is a capacitor body which has substantially the same structure as a conventional solid electrolyte capacitor.

The capacitor body 10 has left and right ends which face each other and upper and lower surfaces. For purposes of exposition, the left end shall be considered the positive (anode) end and the right end shall be considered the negative (cathode) end. Each end is assumed to have a termination which permits the electrical connection of a lead thereto. The capacitor body 10 has an anode riser wire 12, which serves as the anode termination, welded to an anode lead 14. The reference number 16 is a cathode lead connected via a conductive member (not shown) such as a solder or conductive paint (not shown) to the cathode termination of capacitor body 10. The reference number 30 refers to a casing made of an insulating substance in which the capacitor body 10 and anode wire 12 as well as a portion of the anode lead 14 and a portion of the cathode lead 16 are encapsulated. The casing including these elements will be referred to as a capacitor body hereafter.

Figure 5A:
FIGS. 5a, 5b and 5c are a top view, a side view and a bottom view respectively of the chip capacitor embodying the present invention.
Figure 5B:
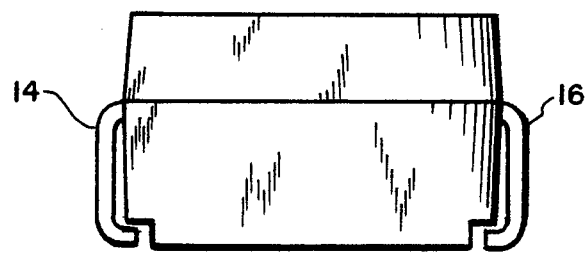
Figure 5C:
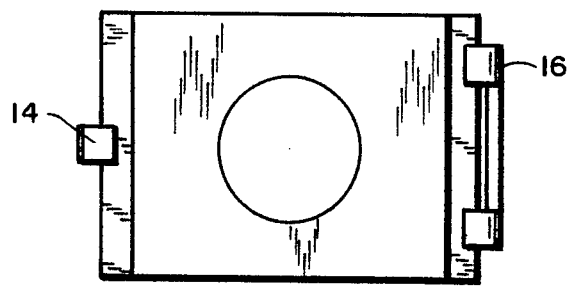
Figure 7A:
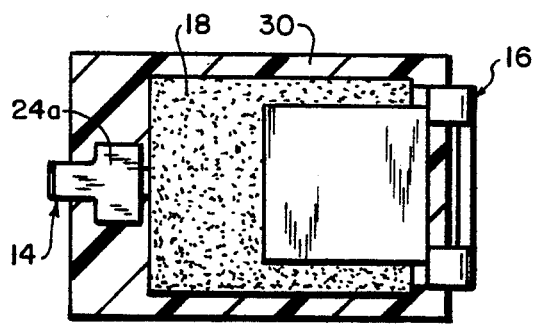
FIGS. 7a and 7b are a top section view and a side section view respectively of the chip capacitor embodying the present invention.
Figure 7B:
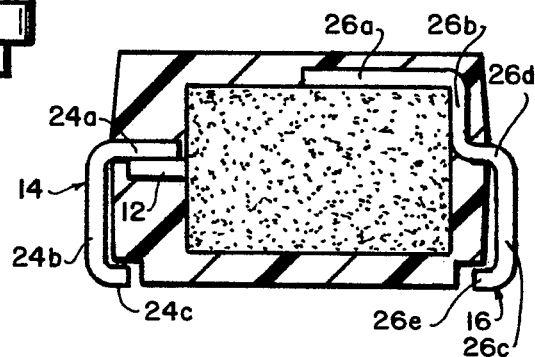
Figure 6A:
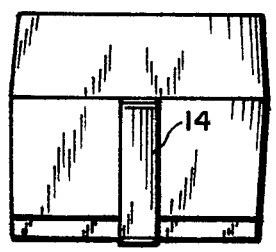
FIGS. 6a and 6b are an anode end view and a cathode end view of the chip capacitor embodying the present invention.
Figure 6B:
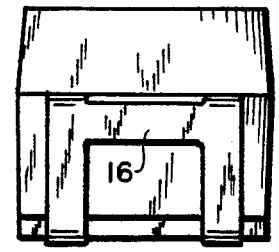

Referring now to FIGS. 3, 5b and 7b, a first conductive lead member, (in the embodiment illustrated the anode lead 14,) is generally J-shaped, narrow in width and centrally positioned, having one leg 24a welded or otherwise secured to one end termination of the polar device, in this case welded to the anode riser wire 12. A second, base leg 24b descends to and is spaced apart from the left end of the device 10. The third and shortest leg 24c extends inward toward the capacitor body 10 as shown in FIG. 3. This lead may extend outward rather than inward.

Referring now to FIGS. 4, 5b and 7b, a second conductive lead member, (in the embodiment illustrated the cathode lead 16), is also generally J-shaped, having one very wide leg 26a (or two separate legs) secured to the top of capacitor body 10, a base leg of several sections, a wide upper section 26b, secured to the cathode terminal by conventional means and positioned parallel to the right end of the capacitor body 10 descending partially down said end, and then bifurcated into two narrow, lower base leg branches 26c secured to the ends of said upper base leg portion 26b by crook-shaped segment 26d, spaced apart from one another, forming a bifurcated cathode lead, each branch 26e of which is bent inward at its base toward the base of said capacitor body. The segments 26e may be bent outward rather than inward. The entire capacitor body 10 with leads attached is encapsulated in an electrically insulating substance 30 such that a portion of the anode lead comprising legs 24b and 24c and a portion of the cathode leads 26c, 26d and 26e are left exposed, as shown in FIGS. 7a and 7b. The encapsulation leaves notches 22 at the base of the encapsulated capacitor body to accommodate the lead portions 24c and 26e to preserve a generally hexahedral chip shape which will be approximately flush with a printed circuit board. In the anode terminal 14, one portion 24a thereof is positioned above the riser wire 12 and welded thereto. This portion of the anode lead 14 is substantially encapsulated within the encapsulated capacitor. The anode lead 14 then extends through the insulation 30, one portion 24b is bent downward parallel to a first end of the capacitor body 10 and another segment 24c is bent thereunder, to form the anode lead termination.

On the other hand, segments 26a, 26b and part of 26d of the cathode lead 16 are embedded in the encapsulation 30, the cathode termination segment 26b above the point of bifurcation is bent slightly inward and upward to make contact with a second end and the top edge of the capacitor body 10 before encapsulation. This is a substantially widened portion 26a of the cathode lead 14 and is secured thereto by a conductive epoxy or solder (not shown). The segments 26b and part of 26d of the cathode termination 16 embedded in the insulating substance have a crook-like shape and the tip portion 26c and 26e of the cathode terminal below of the crook-shape portion 26d have an inverted L-shape so that the cathode layer of the capacitor body is received or engaged by two legs of the cathode lead termination.

In detail, the cathode termination 16 comprises a flat portion connected to the L-shape portion by the crook-shaped portion. The crank-shaped portion is referred to as a neck portion since the width of the crook-shaped portion is smaller than the largest width of the flat portion.

The bifurcation of leads at the second (cathode) end of the polar device is configured such that these branched leads 26c, 26e are spaced wide enough apart to bridge without electrical contact a pad that would be placed on a printed circuit board to receive the first or anode lead. Likewise the anode lead 14 is sufficiently centered and narrow as to fit within pads on a printed circuit board which are positioned to receive the cathode lead termination 16. With this arrangement, the combination of the anode and cathode terminals 14 and 16 has a three lead structure, one lead having a first polarity and two leads having a second polarity.

Since the capacitor chip is constructed in the above-described manner, each of the anode and cathode terminations can be drawn from the capacitor body through the encapsulation when viewed from the front side as shown in the cross-sectional view of FIGS. 5b and 7b at a point which is above a center line dissecting the height of the capacitor body 10. Assuming that the capacitor body is positioned at the center in the direction of the height of the capacitor body, each of the anode and cathode terminations can be drawn outside at a point which is above the center line by one-half the diameter of the anode lead. Accordingly, the thicker the diameter of the anode lead, the higher the drawing point of each of the anode and cathode terminals. As shown in FIGS. 7a and 7b, the above-mentioned flat portions of the anode and cathode terminals are flush with the two end walls of the capacitor body 10. The neck portions and the flat top portions are all embedded in the casing.

The preceding description relates to a preferred embodiment of the invention for use with solid electrolyte capacitors. However, in principle, the anode lead could be bifurcated into two leads and the cathode lead could be the narrow central lead. In practice, this is less feasible for a solid electrolyte capacitor than the embodiment described above.

The spacing of the anode and cathode leads which come into contact with a printed circuit board in a surface mounted application is a critical factor in the design of the fail safe lead configuration for polar devices.

The anode and cathode leads 14, 16 are designed to provide a configuration which minimizes the possibility of placing the unit on a printed circuit board with reverse polarity. If a polar device such as a tantalum capacitor is placed in service with its polarity reversed there is a high probability of the device failing, causing the circuit to malfunction or be damaged. A common placement failure mode and the one most difficult to inspect and detect upon inspection is the situation in which the device is placed in the correct position but is rotated 180°. With the lead configuration as shown in the drawings and discussed above, used in conjunction with a suitable corresponding pad layout on the printed circuit board, a reverse installed polar device will not short out.

Figure 9:
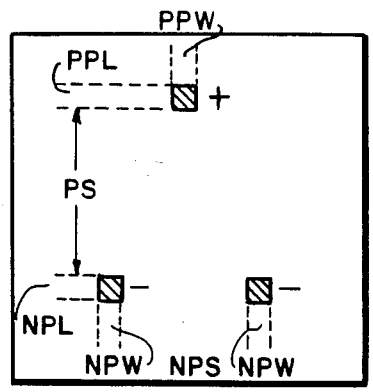
FIG. 9 is a plan view of pad layout on the base of a polar component according to the invention.

FIGS. 8a through 8e show five probable pad and connector layouts for a PC board designed to receive the polar device lead configuration (FIG. 9) of the present invention. (The dual pad end is shown as the negative termination but could be the positive termination without affecting the design.) The principal factor is the spacing between the bifurcated, dual leads with respect to the pad size on the printed circuit board for the single leaded end. In the following discussion it will be assumed that the dual leads are on the cathode or negative termination and the single lead is on the anode or positive termination. It is also assumed that positive and negative pads have substantially the same lengths and widths. If they do not, then appropriate adjustments can be made. If the spacing between the negative pads (NPS) on the printed circuit board is greater than the width of the positive lead 24c, then the capacitor will not have reverse polarity if installed in a reversed position, that is, rotated 180° from the correct position. In this case, the circuit will be open. The greater the difference in this spacing, the greater the tolerance for displacement errors in automatic placement equipment. The distance between the pads (PS) on the opposite ends should also be greater than the negative pad spacing (NPS) to prevent reverse polarity or shorting the circuit if the capacitor is installed in a position that is rotated either 90° or 270° from the correct or intended position. If the spacings just discussed and the pad-size and lead size relationships are followed, the only placement failure mode is an open circuit unless the unit is rotated 180° and displaced. One exception would be the style of pad layout shown on FIG. 8d. Any other placement failure would involve both a 180° rotation of the unit and a displacement of 1.5 to 2.5 times the negative pad width. If the capacitor is rotated at least 90° but less than 180°, this skewed placement error as well as a displacement in the X or Y axis would be easily detected with current automated inspection techniques and equipment.

Figure 8C:
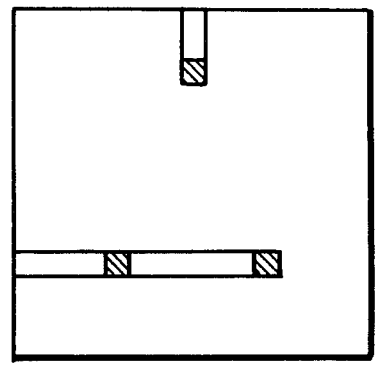
FIGS. 8a through 8e illustrate printed circuit board pad configurations for the lead configuration system of the present invention.
Figure 8A:
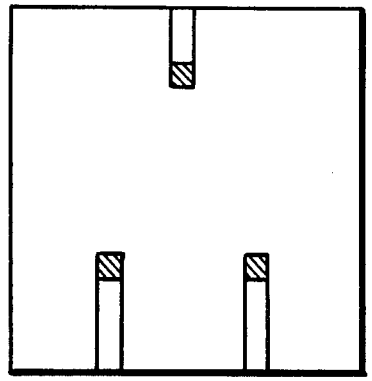
Figure 8D:
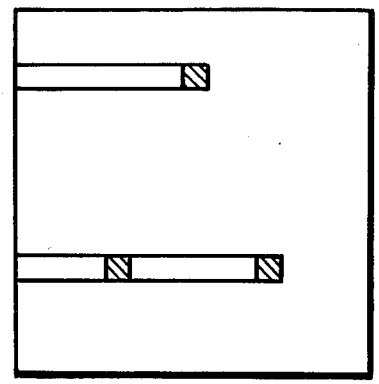
Figure 8B:
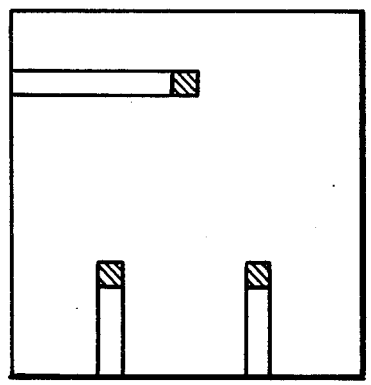
Figure 8E:
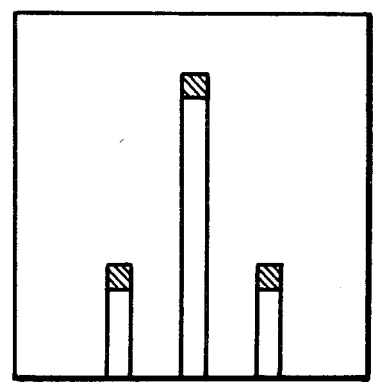

As an additional safeguard, the width of the positive lead (PLW) should be less than the width between the negative pads (NPS) on the printed circuit board. These factors are summarized in the following table:

| TYPE OF PLACE-MENT ERROR | FAILURE ANALYSIS PRINTED CIRCUIT BOARD CONFIGURATION | | | | |
|---|---|---|---|---|---|
| | FIG. 8a | FIG. 8b | FIG. 8c | FIG. 8d | FIG. 8e |
| 1. Rotated 90° or 270° | Open Circuit | Open | Open | Open | Open |
| 2. Rotated 180° | Open | Open | Open | Reverse Polarity | Open |
| 3. Displaced X-Axis >2 NPW | Open | Open | Open | −X = No Bond +X = Open | Open |
| 4. Displaced Y-Axis >2 NPW | Open | Open | Open | Open | +Y = No Bond −Y = Open |
| 5. Rotated 90° or 270° Plus Displaced on X-Axis >2 NPW | Open | Open | Open | Open | Open |
| 6. Rotated | Open | Open | Open | Open | Open |

-continued

FAILURE ANALYSIS

| TYPE OF PLACEMENT ERROR | PRINTED CIRCUIT BOARD CONFIGURATION | | | | |
|---|---|---|---|---|---|
| | FIG. 8a | FIG. 8b | FIG. 8c | FIG. 8d | FIG. 8e |
| 90° or 270° Plus Displaced on Y-Axis >2 NPW | | | | | |
| 7. Rotated 180° Plus Displaced on X-Axis | Rev. Pol. @ ± 1.5 NPW Reopens @ ± 2.5 NPW Open | Rev. Pol. @ ± 1.5 NPW Reopens @ ± 2.5 NPW Open | Rev. Pol. @ ± 1.5 NPW Reopens @ ± 2.5 NPW Open | −X = Rev. Pol. +X opens @ 2.5 NPW Open | Rev. Pol. @ ± 1.5 NPW Reopens @ ± 2.5 NPW −Y = Open +Y = Open to L = 1 Then No Bond |
| 8. Rotated 180° Plus Displaced on Y-Axis >2 NPW | | | | | |

The fail-safe terminal lead configuration for polar devices of the present invention can be produced easily with only minor modifications to a lead frame design. No major modifications are required to the standard two pad manufacturing methods, processes or procedures. Alternative designs would be much more expensive to manufacture.

I claim:

1. A fail-safe lead configuration for surface mounting a polar electronic component having positive and negative leads onto a printed circuit board having spaced apart contact pads for connection to said leads, comprising:
   a first lead electrically connected to a termination of a first polarity on said component;
   a second lead electrically connected to a termination of a second polarity on said component;
   said second lead being bifurcated at a point above the connection point to said printed circuit board such that each branch of the bifurcated lead is adapted for mounting to one of two pads on said printed circuit board for connection of said second lead;
   said first lead having a width which is less than the distance between said two pads for connection of said bifurcated lead; and
   the distance between said lead of said first polarity and said leads of second polarity being greater than the distance between said two branches of said leads of second polarity.

2. The fail-safe configuration of claim 1 further including:
   a set of pads on a printed circuit board adapted for electrical connection of said leads;
   the spacing between the pads for connecting the branches of said bifurcated second lead being greater than the width of the pad for said first lead.

3. The fail-safe lead configuration of claims 1 or 2 wherein said polar component is a solid electrolyte chip capacitor.

4. The fail-safe lead configuration of claims 1, 2, or 3 wherein said leads are J-shaped, each having a first leg secured to a termination of one polarity; a second base leg extending to the connection pads of a printed circuit board and a third leg bent inward and under said device for contact with pads on a printed circuit board.

5. The fail-safe lead configuration of claim 4 wherein said entire component is encapsulated in an electrically insulating substance except segments of said leads required for electrical connection to a printed circuit board.

6. The fail-safe lead configuration of claims 1, 2, or 3 wherein said leads are J-shaped, each having a first leg secured to a termination of one polarity; a second base leg extending to the connection pads of a printed circuit board and a third leg bent outward and away from said device for contact with pads on a printed circuit board.

7. The fail-safe lead configuration of claims 1 or 2 wherein said polar component is a wet electrolyte chip capacitor.

* * * * *